(12) United States Patent
Sekiguchi

(10) Patent No.: US 9,279,860 B2
(45) Date of Patent: Mar. 8, 2016

(54) BATTERY MONITORING SYSTEM AND SEMICONDUCTOR DEVICE

(71) Applicant: LAPIS Semiconductor Co., Ltd., Yokohama (JP)

(72) Inventor: Masaru Sekiguchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 546 days.

(21) Appl. No.: 13/844,208

(22) Filed: Mar. 15, 2013

(65) Prior Publication Data

US 2013/0257441 A1 Oct. 3, 2013

(30) Foreign Application Priority Data

Mar. 30, 2012 (JP) ................................. 2012-082531
Mar. 14, 2013 (JP) ................................. 2013-052078

(51) Int. Cl.
| | |
|---|---|
| G01N 27/416 | (2006.01) |
| G01R 31/36 | (2006.01) |
| H01M 10/48 | (2006.01) |
| B60L 3/00 | (2006.01) |
| B60L 3/12 | (2006.01) |
| B60L 11/18 | (2006.01) |

(52) U.S. Cl.
CPC ........... *G01R 31/3644* (2013.01); *B60L 3/0046* (2013.01); *B60L 3/12* (2013.01); *B60L 11/1859* (2013.01); *B60L 11/1864* (2013.01); *G01R 31/3658* (2013.01); *H01M 10/482* (2013.01); *B60L 2240/547* (2013.01); *H01M 2220/20* (2013.01); *Y02T 10/7005* (2013.01); *Y02T 10/7061* (2013.01); *Y02T 90/16* (2013.01)

(58) Field of Classification Search
USPC .................................................. 324/426, 433
See application file for complete search history.

(56) References Cited

U.S. PATENT DOCUMENTS

2013/0022844 A1* 1/2013 Ishikawa ............ G01R 31/3858
429/61

FOREIGN PATENT DOCUMENTS

| JP | 2009-100644 A | 5/2009 |
|---|---|---|
| JP | 2010-178400 A | 8/2010 |
| JP | 2010-281717 A | 12/2010 |

* cited by examiner

*Primary Examiner* — Robert Grant
(74) *Attorney, Agent, or Firm* — Rabin & Berdo, P.C.

(57) ABSTRACT

A battery monitoring system including: plural battery cell sets; and semiconductor devices, wherein: each of the semiconductor devices includes a measuring section, a high side communication section that is supplied with a drive voltage in a first voltage range, and, when a semiconductor device is present at a higher position that operates at a higher operating voltage than the operating voltage of the semiconductor device itself when measuring a battery cell set on the high side of the battery cell set measured by the semiconductor device itself, can perform communication with the high side semiconductor device, a low side communication section, and a communication level converter; the semiconductor device at the highest stage further includes a signal level determination section; and the first voltage range of the highest stage is set to a specific voltage range narrower than the first voltage range of another of the semiconductor devices.

7 Claims, 11 Drawing Sheets

FIG.4 VMON

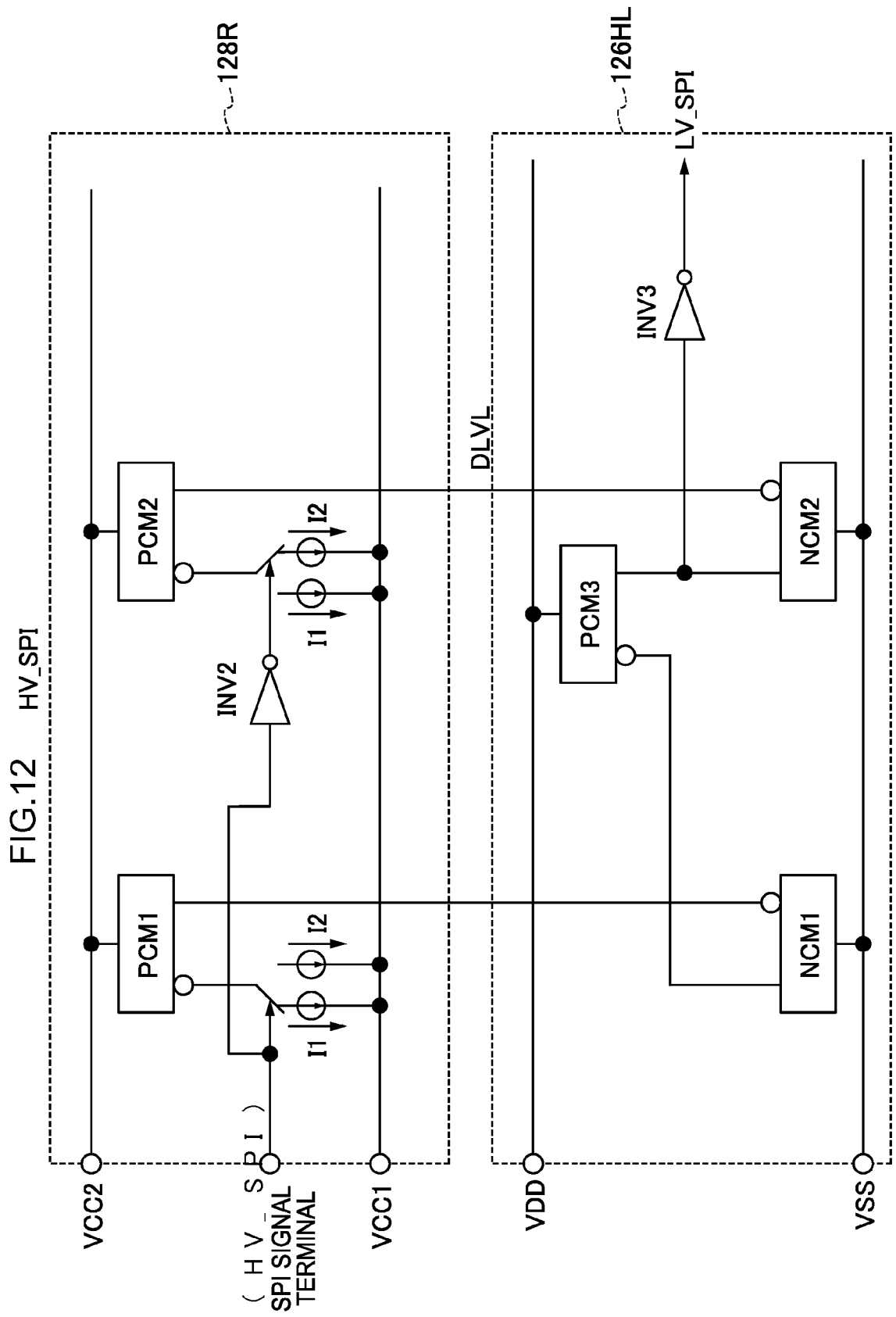

BATTERY MONITORING SYSTEM AND SEMICONDUCTOR DEVICE

CROSS-REFERENCE TO RELATED APPLICATION

This application is based on and claims priority under 35 USC 119 from Japanese Patent Application No. 2012-082531 filed on Mar. 30, 2012 and Japanese Patent Application No. 2013-052078 filed on Mar. 14, 2013, the disclosures of which are incorporated by reference herein.

BACKGROUND

1. Technical Field

The present invention is related to a battery monitoring system and a semiconductor device.

2. Related Art

High capacity, high output batteries employed in as motor drives in for example hybrid vehicles and electric vehicles generally employ a battery configured from plural serially connected batteries (battery cells). Lithium ion rechargeable batteries are employed for example as such battery cells.

Due to the high energy density of such battery cells, there is the concern that this energy might be instantaneously discharged such as when a problem arises that results in an internal short-circuit. In order to avoid such an occurrence, and in order to avoid abnormal states such as an overcharged state or an excessive discharge state, battery voltage monitoring of the battery cells is performed by a battery monitoring system. Examples of such battery monitoring systems include the technology disclosed in Japanese Patent Application Laid-Open (JP-A) No. 2009-100644, JP-A No. 2010-178400, and JP-A No. 2010-281717.

The battery monitoring systems of JP-A No. 2009-100644, JP-A No. 2010-178400 and JP-A No. 2010-281717 are provided with plural battery monitoring semiconductor devices (ICs) that monitor each collection (battery cell set) in a configuration wherein plural serially connected battery cells are divided into collections each containing a specific number of battery cells.

The battery monitoring systems described above are configured such that plural the battery monitoring ICs are connected to the plural serially connected battery cells.

Each battery monitoring IC includes a voltage measuring section that measures battery cell battery voltage, a high side communication section that performs communication with a battery monitoring IC that monitors a higher position battery cell set, a low side communication section that performs communication with a battery monitoring IC that monitors a lower position battery cell set, and a communication level converter that converts the voltage levels of the high side communication section and the low side communication section.

Each battery monitoring IC operates employing a battery voltage of each of the battery cell sets to be monitored. In order to perform communication between the respective battery monitoring ICs there is a need to match the voltage levels employed for signals during communication between the respective battery monitoring ICs since the battery voltage levels of each of the battery cell sets to be monitored are different from each other. The communication level converter accordingly performs conversion between the voltage levels of the high side communication section and the low side communication section.

In such battery monitoring systems, for example the battery monitoring IC that monitors the lowest position battery cell set receives for example a control signal from a controller in the low side communication section, converts the voltage level in the communication level converter, and then transmits the control signal from the high side communication section to the low side communication section of the battery monitoring IC that monitors a higher position battery cell set. Each of the battery monitoring ICs accordingly receives signals in the low side communication section, performs voltage conversion in the communication level converter, and transmits signals from the high side communication section. However, there is no need to operate the communication level converter or the high side communication section of the battery monitoring IC that monitors the highest position battery cell set since there is no higher position battery monitoring IC present.

There is accordingly the issue that current for operating the communication level converter and the high side communication section of the highest position battery monitoring IC is wasted.

SUMMARY

The present invention is proposed in order to address the above issue, and an object thereof is to provide a battery monitoring system and a semiconductor device capable of suppressing the overall current consumption of a battery monitoring system.

A first aspect of the present invention provides a battery monitoring system including:

plural battery cell sets of a specific number plural serially connected battery cells;

plural semiconductor devices that are each respectively provided to each of the plural battery cell sets and that each measure battery voltage of the corresponding battery cell set, wherein:

each of the semiconductor devices includes a measuring section that measures the battery voltage of the corresponding battery cell set, a high side communication section that is supplied with a drive voltage in a first voltage range, and, when a semiconductor device is present at a higher position that operates at a higher operating voltage than the operating voltage of the semiconductor device itself when measuring a battery cell set on the high side of the battery cell set measured by the semiconductor device itself, is capable of performing communication with the high side semiconductor device, a low side communication section that is supplied with a drive voltage in a second voltage range, and, when a semiconductor device is present at a lower position that operates at a lower operating voltage than the operating voltage of the semiconductor device itself when measuring a battery cell set on the low side of the battery cell set measured by the semiconductor device itself, is capable of performing communication with the low side semiconductor device, and a communication level converter that converts in both directions between the first voltage range of the high side communication section and the second voltage range of the low side communication section, that is capable of converting a high side communication signal input from the high side communication section to a low side communication signal and outputting the converted signal to the low side communication section, and that is capable of converting a low side communication section input from the low side communication section to a high side communication section and outputting the converted signal to the high side communication section;

the semiconductor device at the highest stage in communication between the semiconductor devices further comprises a signal level determination section that detects the first voltage range of the high side communication section, and that determines the level of the low side communication signal that the communication level converter outputs to the low side communication section when the first voltage range is narrower than a specific voltage range; and the first voltage range of the highest stage is set to a specific voltage range narrower than the first voltage range of another of the semiconductor devices.

A second aspect of the present invention provides a semiconductor device including:

a high side communication section that is supplied with a drive voltage in a first voltage range, and, when a semiconductor device is present at a higher position that operates at a higher operating voltage than the operating voltage of the semiconductor device itself when measuring a battery cell set on the high side of the battery cell set measured by the semiconductor device itself that is one semiconductor device out of plural semiconductor devices that are each respectively provided to each of plural battery cell sets of collections of a specific number plural serially connected battery cells, is capable of performing communication with the high side semiconductor device;

a low side communication section that is supplied with a drive voltage in a second voltage range, and, when a semiconductor device is present at a lower position that operates at a lower operating voltage than the operating voltage of the semiconductor device itself when measuring a battery cell set on the low side of the battery cell set measured by the semiconductor device itself, is capable of performing communication with the low side semiconductor device;

a communication level converter that converts in both directions between the first voltage range of the high side communication section and the second voltage range of the low side communication section, that is capable of converting a high side communication signal input from the high side communication section to a low side communication signal and outputting the converted signal to the low side communication section, and that is capable of converting a low side communication section input from the low side communication section to a high side communication section and outputting the converted signal to the high side communication section;

a signal level determination section that detects the first voltage range of the high side communication section, and that determines the level of the low side communication signal that the communication level converter outputs to the low side communication section when the first voltage range is narrower than a specific voltage range.

The present invention exhibits the advantageous effect of being able to suppress the overall current consumption of a battery monitoring system.

BRIEF DESCRIPTION OF THE DRAWINGS

Exemplary embodiments of the present invention will be described in detail based on the following figures, wherein:

FIG. 12 is a circuit diagram illustrating an example of an HV-LV converter of a communication level converter and a reception circuit section of the high side communication section of a comparative example.

DETAILED DESCRIPTION

Explanation follows regarding a battery monitoring system and a semiconductor device (battery monitoring IC) for battery monitoring according to a present exemplary embodiment, with reference to the drawings.

Figure 1:
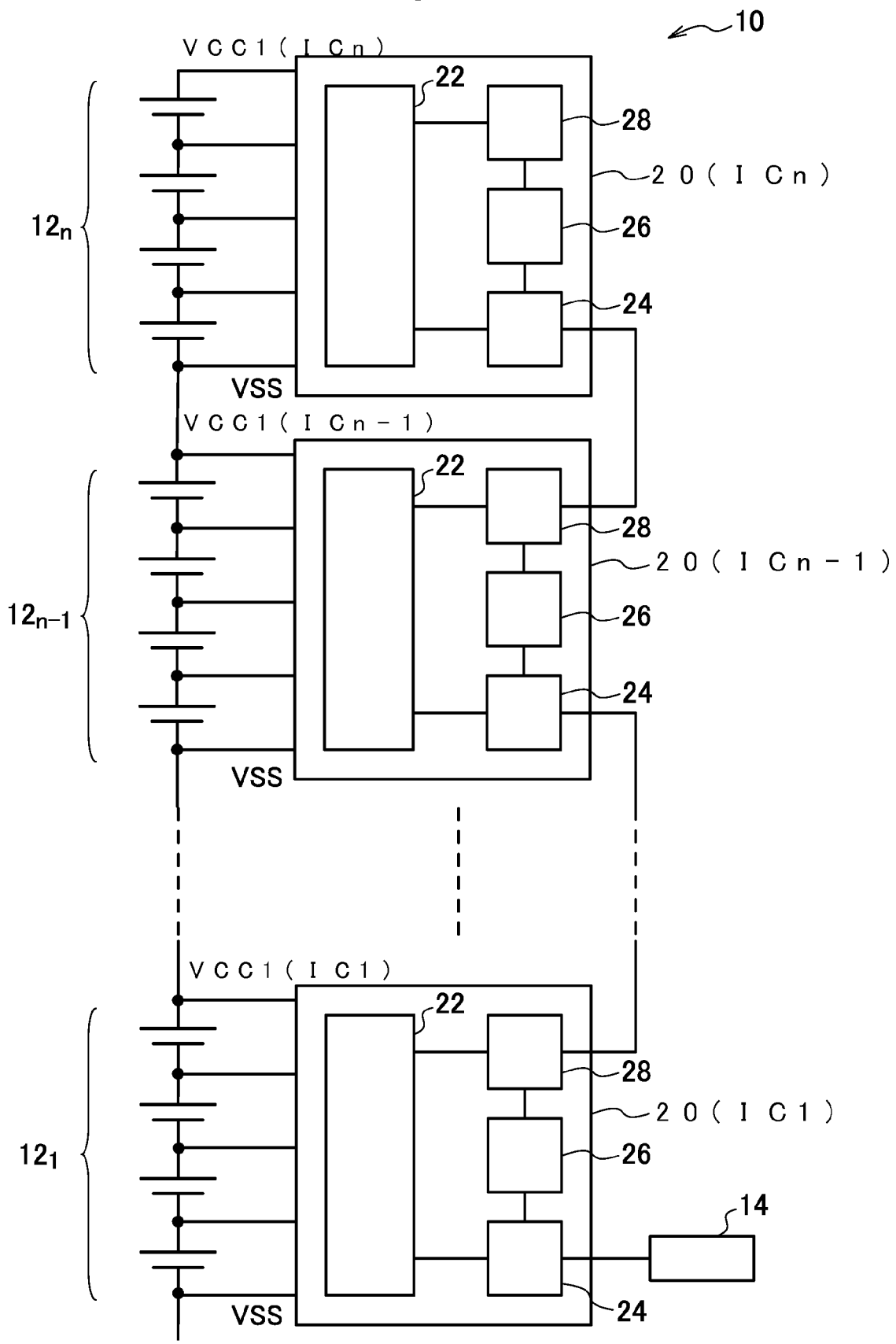
FIG. 1 is a schematic configuration diagram illustrating an example of an outline configuration of a battery monitoring system of a present exemplary embodiment.

Explanation first follows regarding an overall schematic configuration of a battery monitoring system according to the present exemplary embodiment. An example of a schematic configuration of the battery monitoring system according to the present exemplary embodiment is illustrated in FIG. 1. Note that explanation follows regarding a battery monitoring system 10 for monitoring battery voltage of battery cell sets 12 each configured from plural serially connected lithium ion batteries serving as rechargeable batteries, as a specific example of the present exemplary embodiment.

The battery monitoring system 10 in the present exemplary embodiment includes n individual battery cell sets 12 ($12_1$ to $12_n$), battery monitoring Integrated Circuits (ICs) 20 (IC1 to ICn) that monitor the voltage of each of the battery cell sets 12, and a controller 14 for controlling the overall operation of the battery monitoring system 10.

Each of the battery cell sets 12 is equipped with plural individual (four individual in the example in FIG. 1) lithium ion rechargeable battery cells (referred to below simply as "battery cells").

The controller 14 has a function of controlling the battery monitoring system 10 overall, and is configured by a microcomputer equipped with a CPU, ROM and RAM, called an MCU. In the battery monitoring ICs 20 of the present exemplary embodiment, the controller 14 is connected to a low side communication section 24 of the battery monitoring IC 20 (IC1) at the lowest position, and various data (signals) are transmitted and received between the controller 14 and the battery monitoring IC 20 (IC1).

The battery monitoring ICs 20 have the function of monitoring the battery voltage of the battery cell sets 12 they are respectively connected to, and power at a voltage VCC1 is supplied to the battery cell set 12 at the highest position side of the battery cell sets 12 to be monitored.

The battery monitoring ICs 20 are each equipped with a battery voltage measuring section 22 that measures the battery voltage of each of the battery cell sets 12 to be monitored. The battery voltage measuring section 22 has the function of selecting a battery cell from the respective battery cell set 12, outputting the battery voltage of the selected battery cell, and evening out the voltages of the battery cells.

In the present exemplary embodiment, instructions such as instructions related to measuring battery voltage are input from the controller 14 to the battery monitoring IC 20 (IC1) at the lowest position, and then transmitted onwards in sequence to higher position battery monitoring ICs 20. Data such as data related to measured battery voltage values is output from each of the battery monitoring ICs 20 to the controller 14. However data from higher position battery monitoring ICs 20 is transmitted in sequence through the lower position battery monitoring ICs 20. Note that transmission (communication) of signals is performed by serial peripheral interface (SPI) communication as a specific example in the present exemplary embodiment.

Figure 2:
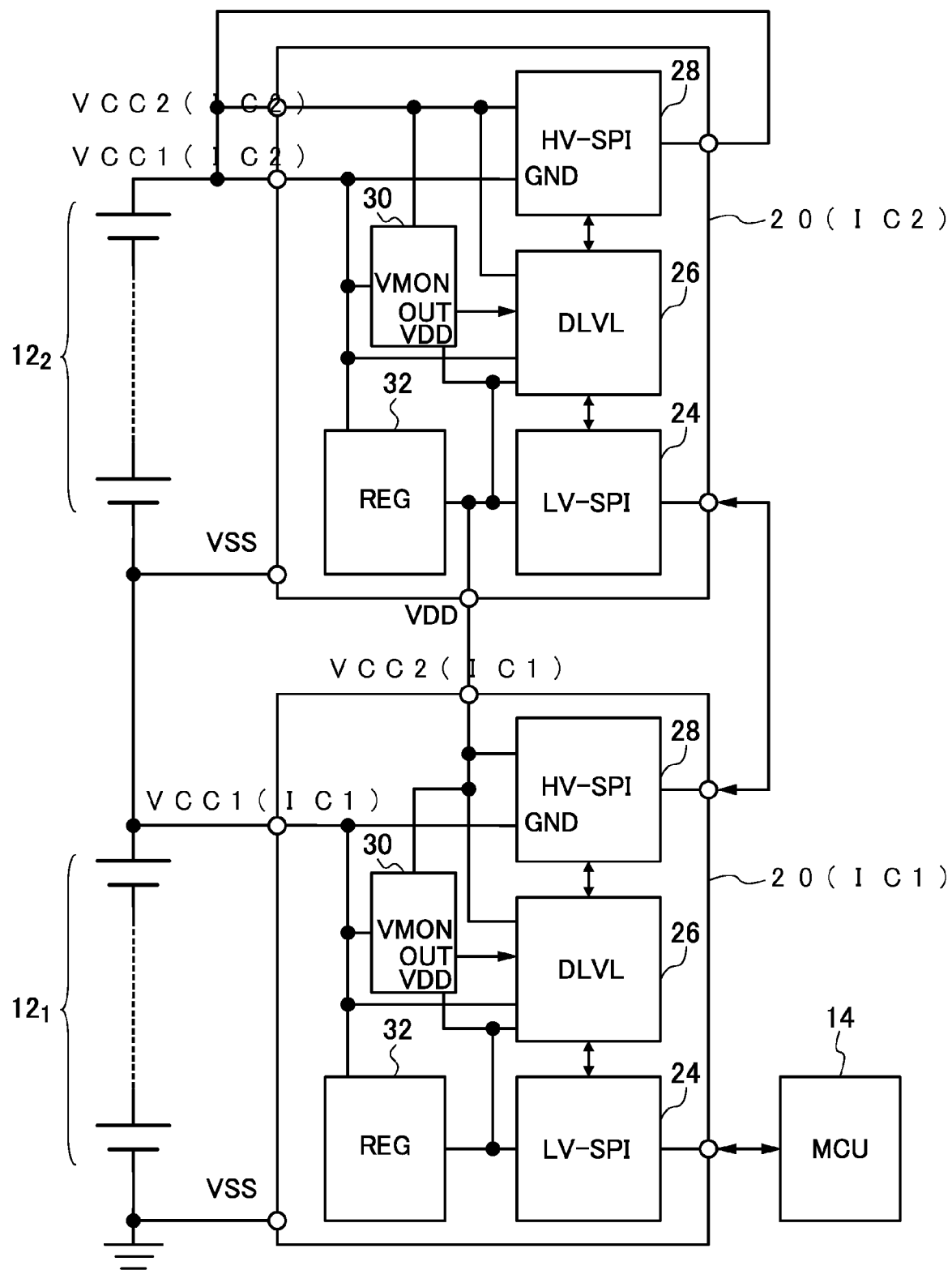
FIG. 2 is a schematic configuration diagram illustrating an example of an outline configuration related to a signal communication function of a battery monitoring IC of the present exemplary embodiment.

FIG. 2 is a schematic configuration diagram illustrating an example of an outline configuration related to a signal communication function of the battery monitoring ICs 20 according to the present exemplary embodiment. FIG. 2 illustrates a system configuration when monitoring battery voltage of the battery cell sets 12 using two individual battery monitoring ICs 20 in the battery monitoring system 10 illustrated in FIG. 1. Note that although a system configured by only two individual battery monitoring ICs 20 is illustrated in order to simplify the drawings, the battery monitoring system 10 may be configured such that battery voltage monitoring of battery cell sets 12 is performed by 3 or more individual battery monitoring ICs 20.

The battery monitoring ICs 20 (IC1, IC2) are each equipped with a battery voltage measuring section 22, a low side communication section (LV-SPI) 24, a communication level converter (DLVL) 26, a high side communication section (HV-SPI) 28, a power supply voltage monitoring circuit (VMON) 30 and a regulator (REG) 32. Note that for simplification purposes the battery voltage measuring section 22 is omitted from illustration in FIG. 2, since the battery voltage measuring section 22 is not directly related to explanation of the operation of the signal communication function.

Explanation first follows regarding configuration of the battery monitoring IC 20 (IC 1), with reference to FIG. 2.

The regulator 32 of the battery monitoring IC 20 (IC1) has a function to generate from a power supply voltage VCC1 (IC1) supplied from the battery cell set 12 a power supply voltage VDD to act as an internal power supply. The generated power supply voltage VDD is supplied to the low side communication section 24, the communication level converter 26, and the power supply voltage monitoring circuit 30.

The power supply voltage monitoring circuit 30 of the battery monitoring IC 20 (IC1) is connected to a power supply voltage VCC1 (IC1) and a power supply voltage VCC2 (IC 1), and has a function to monitor the power supply voltage VCC1 (IC1) and the power supply voltage VCC2 (IC1), and to output to the communication level converter 26 a signal INV corresponding to the potential difference between the power supply voltage VCC1 (IC1) and the power supply voltage VCC2 (IC1).

The operating voltage of the low side communication section 24 is the power supply voltage VDD from the regulator 32, with GND of voltage VSS. The low side communication section 24 of the battery monitoring IC 20 (IC1) is connected to the controller 14 through an SPI signal line.

The communication level converter 26 of the battery monitoring IC 20 (IC1) is connected to the power supply voltage VCC1 (IC1), the power supply voltage VCC2 (IC1), the power supply voltage VDD, and the power supply voltage monitoring circuit 30. In the present exemplary embodiment a digital level shifter is employed as an example of the communication level converter 26. An SPI signal is received from the high side communication section 28 based on the level of the signal INV input from the power supply voltage monitoring circuit 30. The voltage level of the SPI signal received from the high side communication section 28 is converted to a voltage level corresponding to the low side communication section 24 and output to the low side communication section 24. The voltage level of the SPI signal received from the low side communication section 24 is converted to a voltage level corresponding to the high side communication section 28 and output to the high side communication section 28.

The operating voltage of the high side communication section 28 of the battery monitoring IC 20 (IC1) is the power supply voltage VCC2 (IC1) supplied from the battery monitoring IC 20 (IC2) through the VDD terminal, with GND of the power supply voltage VCC1 (IC1) of the battery cell set 12. The power supply voltage VCC2 (IC1) supplied to the high side communication section 28 of the battery monitoring IC 20 (IC1) is the power supply voltage VDD of the battery monitoring IC 20 (IC2). At the battery monitoring IC 20 (IC1), VCC2 (IC1)−VCC1 (IC2)=the power supply voltage VDD of the battery monitoring IC 20 (IC2). The high side communication section 28 of the battery monitoring IC 20 (IC1) is connected to the low side communication section 24 of the battery monitoring IC 20 (IC2) through the SPI signal line.

Explanation follows regarding a configuration of the battery monitoring IC 20 (IC2), with reference to FIG. 2.

The regulator 32 of the battery monitoring IC 20 (IC1) has a function to generate from a power supply voltage VCC1 (IC2) supplied from the battery cell set 12$_2$ a power supply voltage VDD to act as an internal power supply. The generated power supply voltage VDD is supplied to the low side communication section 24, the communication level converter 26, and the power supply voltage monitoring circuit 30.

The power supply voltage monitoring circuit 30 of the battery monitoring IC 20 (IC2) is connected to a power supply voltage VCC1 (IC2) and a power supply voltage VCC2 (IC2), and has a function to monitor the power supply voltage VCC1 (IC2) and the power supply voltage VCC2 (IC2), and to output to the communication level converter 26 a signal INV corresponding to the potential difference between the power supply voltage VCC1 (IC2) and the power supply voltage VCC2 (IC2).

The operating voltage of the battery monitoring IC 20 (IC2) low side communication section 24 is the power supply voltage VDD from the regulator 32, with GND of voltage VSS. The low side communication section 24 of the battery monitoring IC 20 (IC2) is connected to the high side communication section 28 of the battery monitoring IC 20 (IC1) through an SPI signal line.

The communication level converter 26 of the battery monitoring IC 20 (IC2) is connected to the power supply voltage VCC1 (IC2), the power supply voltage VCC2 (IC2), the power supply voltage VDD, and the power supply voltage monitoring circuit 30. In the present exemplary embodiment a digital level shifter is employed as an example of the communication level converter 26 as described above. The communication level converter 26 is configured substantially the same as that of the battery monitoring IC 20 (IC1) described above.

The operating voltage of the high side communication section 28 of the battery monitoring IC 20 (IC2) is the power supply voltage VCC2 (IC2), with GND of the power supply voltage VCC1 (IC2) of the battery cell set 12$_2$. Since the high side communication section 28 of the battery monitoring IC 20 (IC2) is not employed (is not connected to a battery monitoring IC 20 on the high side), in place of a battery monitoring IC 20 on the high side, the power supply voltage VCC1 (IC2) and the power supply voltage VCC2 (IC2) are connected together. At the battery monitoring IC 20 (IC2), VCC1 (IC2)= VCC2 (IC2).

Since the battery monitoring IC 20 (IC2) is the highest position battery monitoring IC 20, there is no need to perform communication (SPI communication) with a battery monitoring IC 20 on the high side. There is accordingly no need to operate the communication level converter 26 and the high side communication section 28. However, since the communication level converter 26 and the high side communication section 28 are connected to the power supply voltage VCC1 (IC2) and the power supply voltage VCC2 (IC2), the communication level converter 26 and the high side communication section 28 operate unintentionally in response to a potential difference between the power supply voltage VCC1 (IC2) and the power supply voltage VCC2 (IC2). More specifically, the communication level converter 26 and the high side communication section 28 are unintentionally driven when the voltage level of VCC2 (IC2)–VCC1 (IC2) exceeds the drive voltage (threshold value voltage) of an electronic component (for example a MOS transistor) configuring the communication level converter 26 and the high side communication section 28. Note that "driving" of the communication level converter 26 in the present exemplary embodiment refers to the communication level converter 26 operating to perform SPI communication with the battery monitoring IC 20 on the high side. Moreover, "driving" of the high side communication section 28 refers to the high side communication section 28 operating to perform SPI communication. The current consumption is increased by operation of the communication level converter 26 and the high side communication section 28. In the present exemplary embodiment VCC1 (IC2)= VCC2 (IC2) such that the communication level converter 26 and the high side communication section 28 are not driven. Note that configuration may be made such that even when VCC1 (IC2) does not exactly equal VCC2 (IC2), the voltage level of VCC2 (IC2)–VCC1 (IC2) is less than the operating voltages of the communication level converter 26 and the high side communication section 28.

Figure 3:
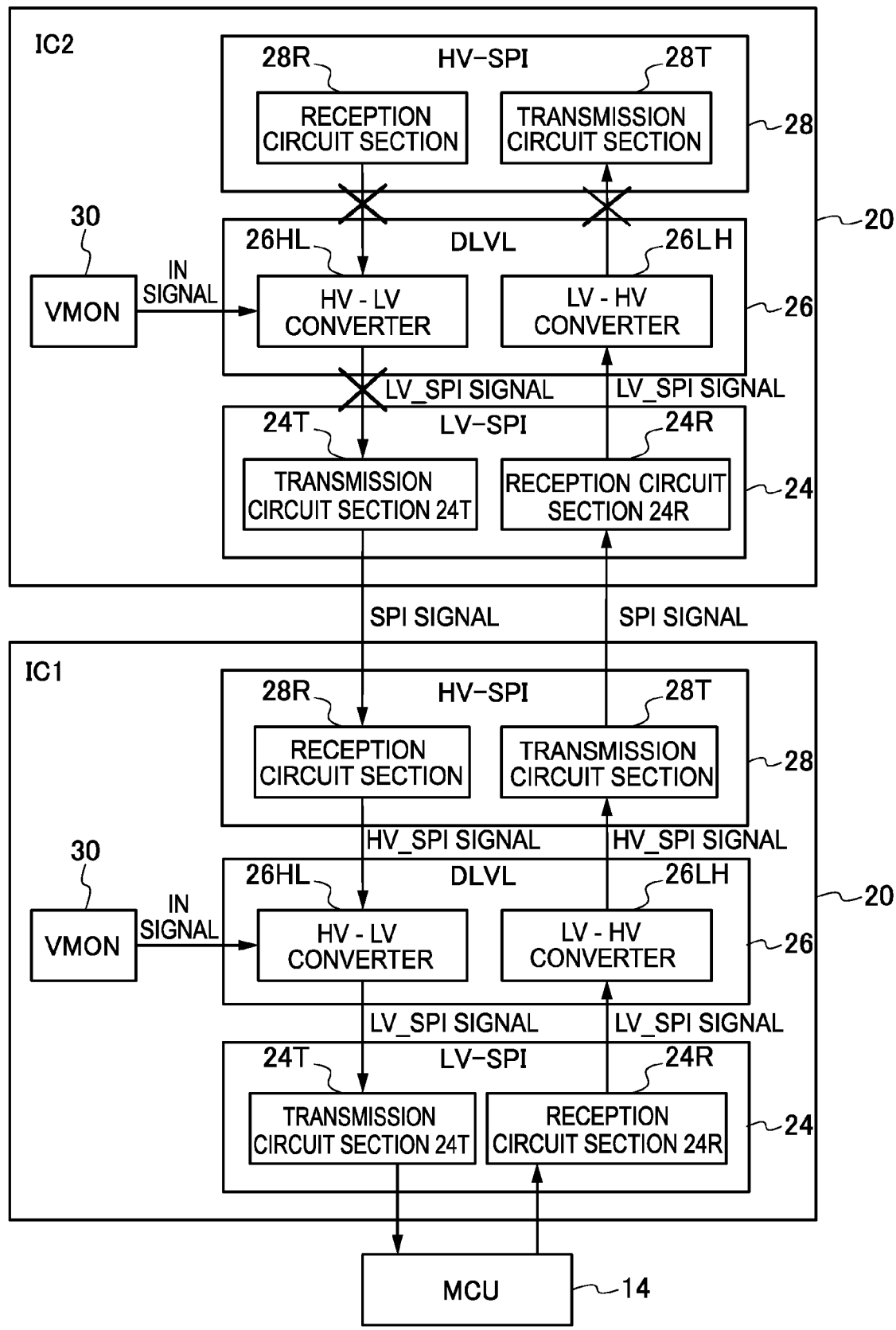
FIG. 3 is a block diagram showing an example of specific communication functions in a battery monitoring IC of the present exemplary embodiment.

Detailed explanation follows regarding SPI communication by the battery monitoring IC 20 according to the present exemplary embodiment, with reference to the drawings. FIG. 3 is an example of a block diagram illustrating an example of specific communication functions in the battery monitoring IC 20 illustrated in the schematic diagram of FIG. 2. Note that for the purpose of simplifying the drawing, parts of the configuration not relevant to the following explanation are not illustrated in FIG. 3.

The low side communication section 24 in the present exemplary embodiment includes a reception circuit section 24R and a transmission circuit section 24T. The communication level converter 26 is equipped with a LV-HV converter 26LH, and a HV-LV converter 26HL. The high side communication section 28 is equipped with a transmission circuit section 28T and a reception circuit section 28R.

Figure 4:
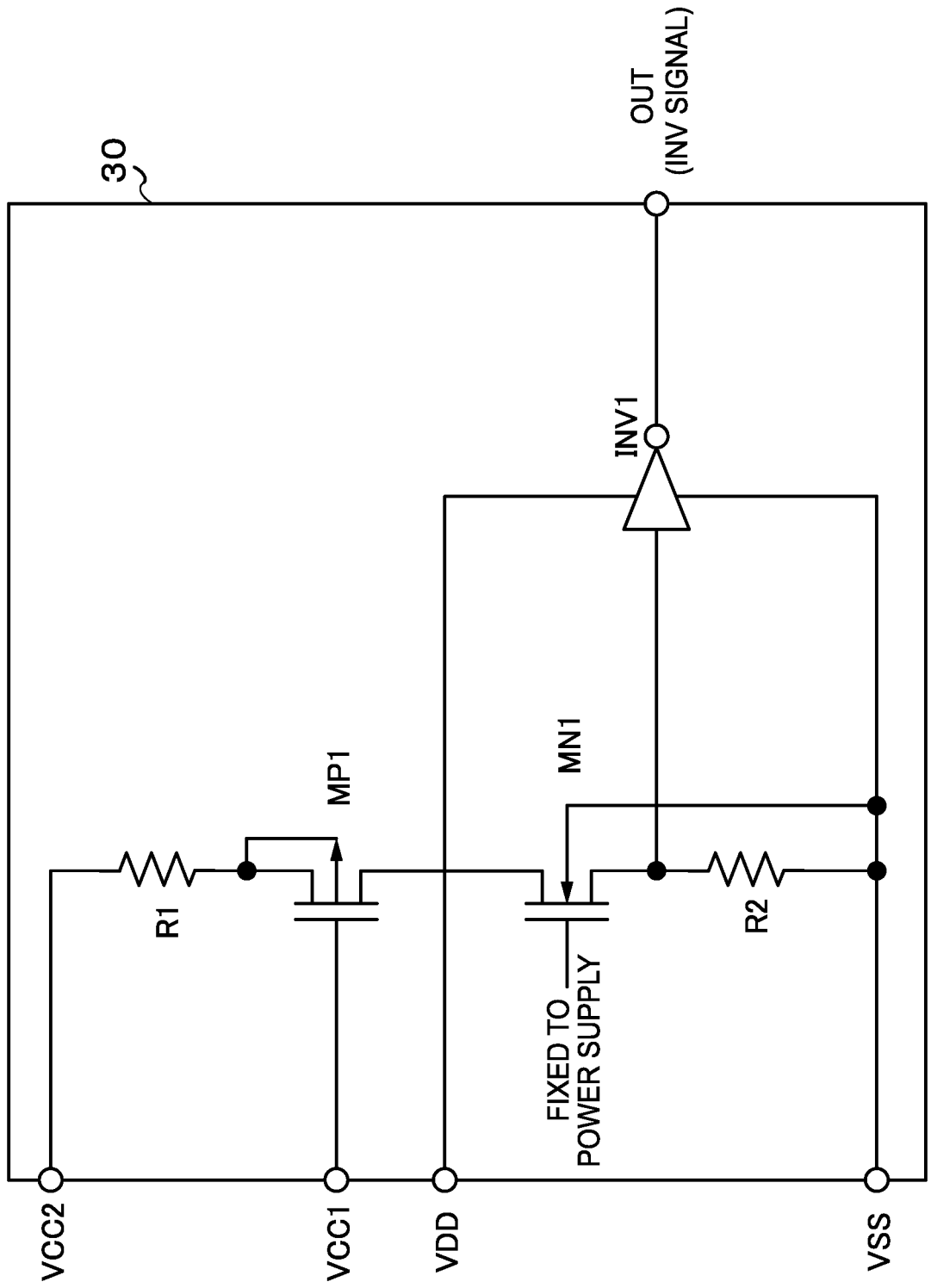
FIG. 4 is a circuit diagram illustrating an example of a battery voltage monitoring circuit of the present exemplary embodiment.

The power supply voltage monitoring circuit 30 includes a function for fixing (described in detail later) an input voltage of an inverter provided to the HV-LV converter 26HL. FIG. 4 is a circuit diagram illustrating an example of the power supply voltage monitoring circuit 30.

The power supply voltage monitoring circuit 30 of the present exemplary embodiment is equipped with a resistor R1, a resistor R2, a PMOS transistor MP1, an NMOS transistor MN 1, and an inverter INV1.

One end of the resistor R1 is connected to the power supply voltage VCC2, and the other end is connected to the source and bulk of the PMOS transistor MP1. The drain of the PMOS transistor MP1 is connected to the drain of the NMOS transistor MN1 and the gate is connected to the power supply voltage VCC1. The gate of the NMOS transistor MN1 is fixed to a power supply and the source is connected to one end of the resistor R2 and to the input of the inverter INV1. The bulk of the NMOS transistor MN1 is connected to the voltage VSS. One end of the resistor R2 is connected to the input of the inverter INV1. The other end of the resistor R2 is connected to the voltage VSS. The power supply to the inverter INV1 is the power supply voltage VDD, and GND is connected to voltage VSS. The output of the inverter INV1 is connected to OUT, and the signal INV is output from the inverter INV1.

Explanation follows regarding operation of the power supply voltage monitoring circuit 30. Note that when it is not necessary to discriminate between the battery monitoring IC 20 (IC1) and the battery monitoring IC 20 (IC2) when referring to the power supply voltage VCC1 (IC1, IC2) and the power supply voltage VCC2 (IC1, IC2), the symbols (IC1, IC2) are omitted and reference is made to power supply voltage VCC1 and power supply voltage VCC2 respectively.

Explanation first follows regarding operation in a case when VCC2–VCC1=VDD (in the battery monitoring IC 20 (IC1)). The PMOS transistor MP1 is in an ON state due to the potential difference between the power supply voltage VCC2 and the power supply voltage VCC 1. The gate of the NMOS transistor MN1 is fixed to the power supply, and the NMOS transistor MN1 is always in an ON state. Current accordingly flows in the resistor R1 and the resistor R2. A voltage is accordingly generated across the resistor R2 due to the current flow in the resistor R2. The input of the inverter INV1 is accordingly at H level, and a detection signal (INV signal) is output at L level. Hence when VCC2–VCC1=VDD, the detection signal (INV signal) of the power supply voltage monitoring circuit 30 is at L level.

Explanation follows regarding operation when VCC1=VCC2 (in the battery monitoring IC 20 (IC2)). The PMOS transistor MP1 is in an OFF state since there is no potential difference between the power supply voltage VCC1 and the power supply voltage VCC2. Since current does not flow in the resistor R1, current also does not flow in the resistor R2. The input of the inverter INV1 is accordingly at L level, and the output detection signal (INV signal) is at H level.

Figure 5:
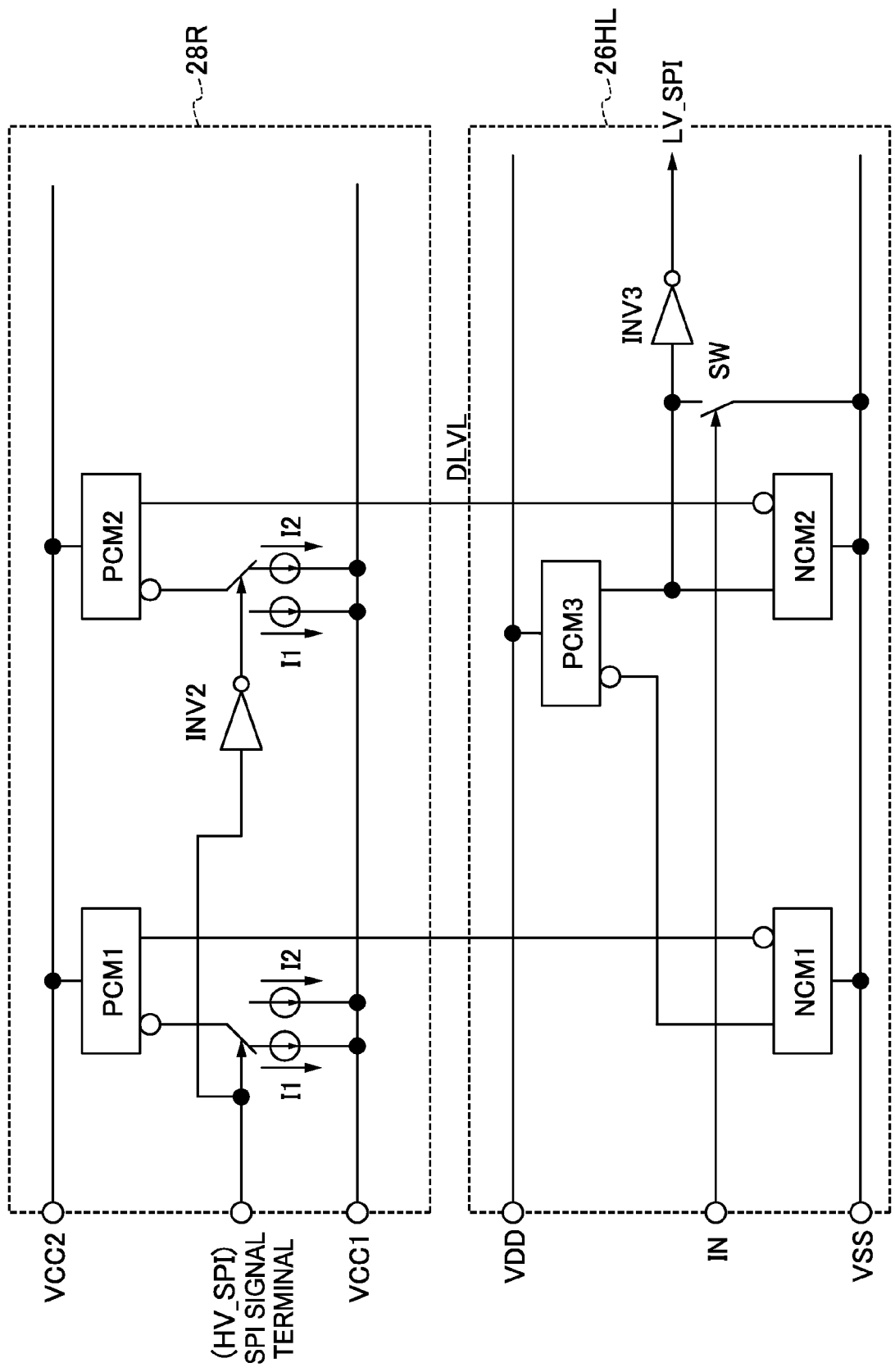
FIG. 5 is a circuit diagram illustrating an example of an HV-LV converter of a communication level converter and a reception circuit section of a high side communication section of the present exemplary embodiment.

In the communication level converter 26, the input of an inverter INV3 of the HV-LV converter 26HL is fixed according to the level of the INV signal. Detailed explanation follows of such operation, with reference to the drawings. FIG. 5 is a circuit diagram illustrating an example in the present exemplary embodiment of the HV-LV converter 26HL of the communication level converter 26 and the reception circuit section 28R of the high side communication section 28.

The reception circuit section 28R is equipped with a current mirror circuit PCM1, a current mirror circuit PCM2, an inverter INV2, a constant current source I1 and a constant current source I2. The HV-LV converter 26HL is equipped with a current mirror circuit PCM3, a current mirror circuit NCM1, a current mirror circuit NCM2, an inverter INV3 and a switching element SW.

Figure 6:
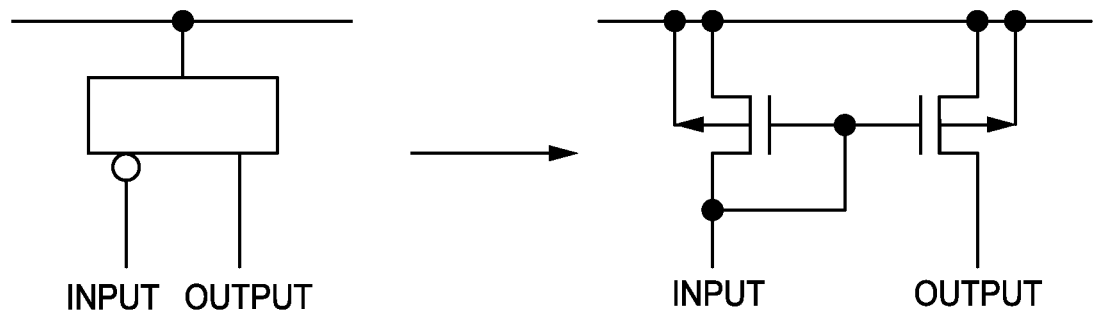
FIG. 6 is a circuit diagram illustrating a specific example of a current mirror circuit configured by PMOS transistors of the present exemplary embodiment.
Figure 7:
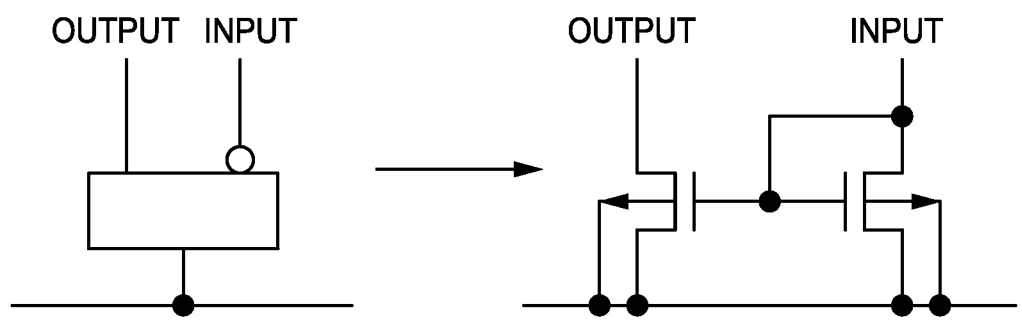
FIG. 7 is a circuit diagram illustrating a specific example of a current mirror circuit configured by NMOS transistors of the present exemplary embodiment.

The current mirror circuit PCM1, the current mirror circuit PCM2 and the current mirror circuit PCM3 are current mirror circuits configured by PMOS transistors. A specific example of these current mirror circuits is illustrated in FIG. 6. The current mirror circuit NCM1 and the current mirror circuit NCM2 are current mirror circuits configured by NMOS transistors. A specific example of these current mirror circuits is illustrated in FIG. 7.

In the reception circuit section 28R, the input of the current mirror circuit PCM1 is connected to a constant current source and the output is connected to the current mirror circuit NCM1 of the HV-LV converter 26HL. The input of the current mirror circuit PCM2 is connected to a constant current source and the output is connected to a current mirror circuit NCM2 of a HV-LV converter 26HL.

In the HV-LV converter 26HL, the input of the current mirror circuit NCM1 is connected to the output of the current mirror circuit PCM1 and the output is connected to the input of the current mirror circuit PCM3. The input of the current mirror circuit NCM2 is connected to the output of the current mirror circuit PCM2 and the output is connected to the output of the current mirror circuit PCM3. The output of the current mirror circuit PCM3 is also connected to the input of the inverter INV3. The switching element SW is ON/OFF controlled according to the level of the signal INV input from the power supply voltage monitoring circuit 30. The switching element SW is in an OFF state when the signal INV is at L level, and the switching element SW is in an ON state when the signal INV is at H level. A signal LV_SP1 is output from the inverter INV3.

The SPI signal input from the battery monitoring IC 20 on the high side is input from the SPI signal terminal of the reception circuit section 28R. When the SPI signal is at L level, the input of the current mirror circuit PCM1 is connected to the constant current source I1 and the input of the current mirror circuit PCM2 is connected to the constant current source I2. On the other hand, when the SPI signal is at H level, the input of the current mirror circuit PCM1 is connected to the constant current source I2, and the input of the current mirror circuit PCM2 is connected to the constant current source I1.

Explanation follows regarding operation of the HV-LV converter 26HL and the reception circuit section 28R when VCC2−VCC1=VDD (in the battery monitoring IC 20 (IC1)). Note that in such cases the INV signal is at L level, and the switching element SW is in an OFF state.

Explanation follows regarding an example when the SPI signal line is at L level. The input current of the current mirror circuit PCM1 is the current I1 and the output current is also current I1. The input current of the current mirror circuit PCM2 is current I2 and the output current is also current I2.

The input current of the current mirror circuit NCM1 is current I1 and therefore the output current is also current I1. The input current of the current mirror circuit NCM2 is current I2 and therefore the output current is also current I2. In the current mirror circuit PCM3, when current I1 is much greater than current I2, the output current also attempts to be current I1 according to the input current I1, however the output current by the current mirror circuit NCM2 is current I2, and so I1=I2. In such cases, the input voltage of the inverter INV3 is power supply voltage VDD. However when I1 is much less than current I2, the input voltage of the inverter INV3 is voltage VSS.

Explanation follows regarding operation of the HV-LV converter 26HL and the reception circuit section 28R when VCC2=VCC1 (in the battery monitoring IC 20 (IC2)). Note that in such cases the INV signal is at H level and the switching element SW is in an ON state. The input voltage of the input to the inverter INV3 is 0V (VSS) due to the ON state of the switching element SW. The input voltage of the inverter INV3 is accordingly fixed, and shoot-through current does not flow.

Figure 11:
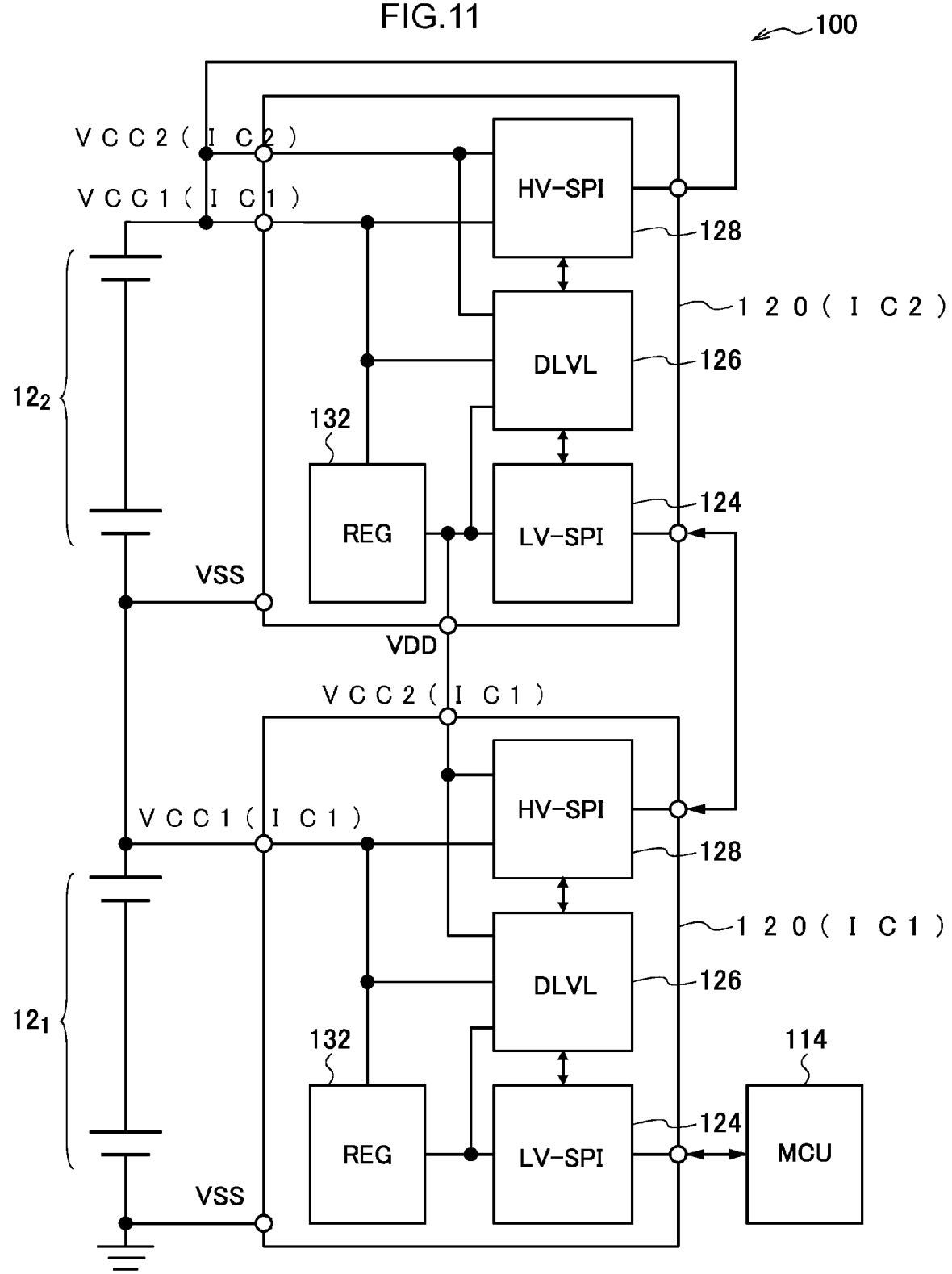
FIG. 11 is a schematic configuration diagram illustrating an example of an outline configuration related to a signal communication function of a battery monitoring IC of a comparative example.

As a comparative example, explanation follows regarding configuration and operation of an HV-LV converter of a communication level converter and a reception circuit section of a high side communication section of a battery monitoring system when a communication level converter is not provided to the battery monitoring IC. A schematic diagram of an example of an outline configuration of a battery monitoring system 100 of a comparative example is illustrated in FIG. 11. As illustrated in FIG. 11, the battery monitoring system 100 of the comparative example is equipped with a controller 114 and two individual battery monitoring ICs 120 (IC1, IC2). The battery monitoring ICs 120 of the comparative example are not equipped with the power supply voltage monitoring circuit 30 provided to the battery monitoring IC20 of the present exemplary embodiment, however they are otherwise configured substantially similarly.

FIG. 12 is a circuit diagram of an example of a HV-LV converter 126HL of a communication level converter and a reception circuit section 128R of a higher voltage communication section in the comparative example. As illustrated in FIG. 12, the configuration of the reception circuit section 128R of the comparative example is a configuration substantially the same as the reception circuit section 28R of the present exemplary embodiment. On the other hand, as illustrated in FIG. 12, the HV-LV converter 126HL of the comparative example is not equipped with the switching element SW provided to the HV-LV converter 26HL of the present exemplary embodiment. The input of the inverter INV3 is only connected to the output of a current mirror circuit PCM3 (the output of the current mirror circuit NCM2).

Operation of the HV-LV converter 126HL and the reception circuit section 128R when VCC2−VCC1=VDD (when VCC2 (IC1)−VCC1 (IC2)=VDD in the battery monitoring IC 120 (IC1)) is substantially the same as the operation of the HV-LV converter 26HL and the reception circuit section 28R described above for the present exemplary embodiment, and so further explanation thereof will be omitted.

Further, operation of the HV-LV converter 126HL and the reception circuit section 128R when VCC1=VCC2 (when VCC1 (IC2)=VCC2 (IC2) in the battery monitoring IC120 (IC2)) differs from the operation described above for the HV-LV converter 26HL and the reception circuit section 28R. Since a high side communication section 128 does not operate, the output current of the current mirror circuit PCM1 and the current mirror circuit PCM2 of the reception circuit section 128R is zero. The output currents of the current mirror circuit NCM1, the current mirror circuit NCM2 and the current mirror circuit PCM2 are accordingly also zero. Since the output currents of the current mirror circuit PCM3 and the current mirror circuit NCM2 are both zero, the input voltage of the inverter INV3 is indeterminate, and shoot-through current flows in the circuit of the inverter INV3. The current consumption accordingly increases. The shoot-through current stops flowing when the input voltage of the inverter INV3 settles to either L level or H level, due for example to leak current. However time is required (as a specific example about 10 to 20 seconds) until the level of the input voltage settles down and the shoot-through current stabilizes, namely until the shoot-through current settles down to a desirable current value or lower. Note that since the current consumption is unstable, sometimes a problem arises of the current consumption increasing, as described. Moreover, in the battery monitoring IC 120 (IC2), since time is required until the shoot-through current settles down to a desirable current value or lower, sometimes the measurement result of the battery voltage of the highest position cell battery also fluctuates due to the influence of the shoot-through current, and as a result the measurement precision of the battery voltage of the battery cell set 12 decreases.

On the other hand, in the HV-LV converter 26HL and the reception circuit section 28R of the present exemplary embodiment as described above, when VCC1=VCC2, even when the signal from the reception circuit section 28R to the HV-LV converter 26HL is indeterminate, the switching element SW is in the ON state due to the H level INV signal, and the input voltage of input to the inverter INV3 is fixed to 0V, so shoot-through current does not flow. The current consumption can accordingly be stabilized quickly, and a difference does not arise in current consumption between the battery monitoring IC 20 (IC 1) and the battery monitoring IC 20 (IC2). Moreover, since the current consumption is stabilized quickly, the measurement precision of the battery voltage of the battery cell set 12 does not decrease.

Figure 8:
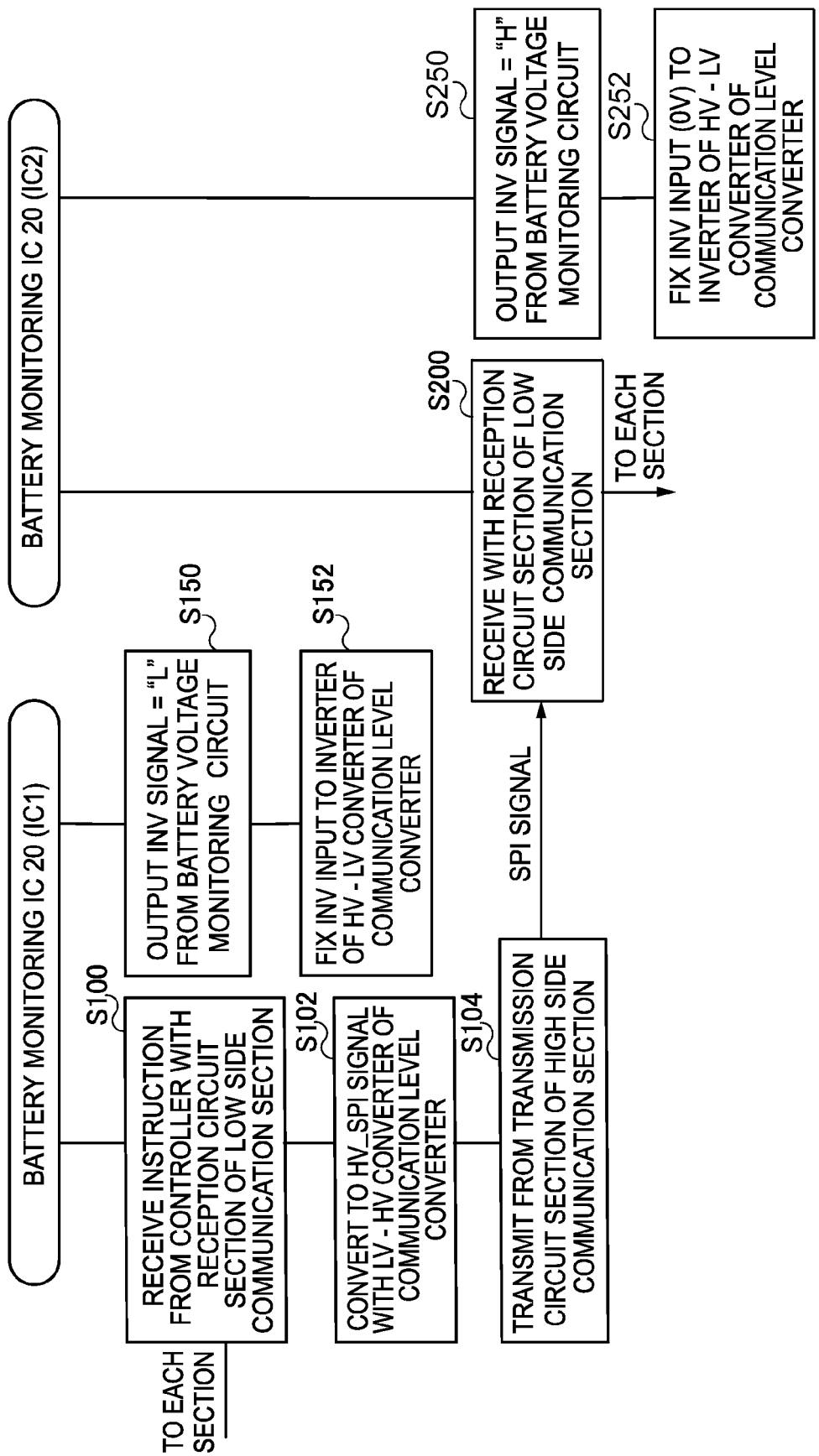
FIG. 8 is a flow chart illustrating an example of a flow of communication operation in a battery monitoring system of the present exemplary embodiment.

Explanation follows regarding a flow of communication operations in the battery monitoring system 10 of the present exemplary embodiment when the SPI signal output from the controller 14 is transmitted (communicated) to the battery monitoring IC 20 (IC1) and the battery monitoring IC 20 (IC2). FIG. 8 illustrates a flow chart of an example of flow of communication operation in the battery monitoring system 10. As a specific example, explanation follows regarding a case in which an instruction (SPI signal) is communicated in order to run each of the battery monitoring ICs 20 when starting up the battery monitoring ICs 20 or on resumption after a power save mode (sleep mode).

Start up or operation resumption from power save mode is started when the controller 14 detects driving of an engine. The controller 14 outputs to the battery monitoring ICs 20 (IC1) an instruction (SPI signal) to run each of the battery monitoring ICs 20.

First the battery monitoring IC 20 (IC1) receives the SPI signal output from the controller 14 with the reception circuit section 24R of the low side communication section 24 (step S100 in FIG. 8). The received SPI signal is transmitted to each of the sections of the battery monitoring IC 20 (IC1), such as the battery voltage measuring section 22 and a non-illustrated MCU (a logic circuit for controlling the battery monitoring IC 20 (IC1)), and a specific run operation is executed.

On the other hand, in the power supply voltage monitoring circuit 30 of the battery monitoring IC 20 (IC1), the VCC2−VCC1=VDD, and therefore an INV signal is generated and output at L level (step 150 of FIG. 8). In the communication level converter 26, the input to the inverter INV3 of the HV-LV converter 26HL is fixed as described above by the L level INV signal (step 152 of FIG. 8).

The SPI signal (LV_SPI signal) received by the reception circuit section 28R is converted by the LV-HV converter 26LH of the communication level converter 26 from the voltage level LV of the low side communication section 24 to the SPI signal (HV_SPI signal) of the voltage level HV of the high side communication section 28 (step 102 of FIG. 8). Reference here to the voltage level HV of the high side communication section 28 means the voltage level of the battery monitoring IC 20 on the high side (IC2) (the voltage level of the low side communication section 24 of the battery monitoring IC 20 (IC2)). The HV_SPI signal is transmitted from the transmission circuit section 28T of the high side communication section 28 to the battery monitoring IC 20 (IC2) (step 104 of FIG. 8)

The SPI signal transmitted from the battery monitoring IC 20 (IC 1) is received by the reception circuit section 24R of the low side communication section 24 in the battery monitoring IC 20 (IC2). The received SPI signal is transmitted to each of the sections of the battery monitoring IC 20 (IC2), such as the battery voltage measuring section 22 and a non-illustrated MCU (a logic circuit for controlling the battery monitoring IC 20 (IC2)), and a specific run operation is executed. Each of the battery monitoring ICs 20 (IC1, IC2) of the battery monitoring system 10 is accordingly placed in a run state.

Note that in the battery monitoring IC 20 (IC2), the LV_SPI signal in response to the received SPI signal is output from the reception circuit section 24R to the LV-HV converter 26LH of the communication level converter 26, however since VCC1=VCC2, the communication level converter 26 and the high side communication section 28 do not operate.

In the power supply voltage monitoring circuit 30 of the battery monitoring IC 20 (IC2), since VCC1=VCC2, an INV signal at H level is generated and output (step 250 of FIG. 8). In the communication level converter 26, as described above, the input of the inverter INV3 of the HV-LV converter 26HL is fixed by the H level INV signal, and current consumption is stabilized quickly (step 252 of FIG. 8).

Thus, since the current consumption of the battery monitoring IC 20 (IC1) and the battery monitoring IC 20 (IC2) are quickly made stable, there is no reduction in measurement precision even when measuring the battery voltage of each of the battery cell sets 12 straight after instruction to run has been issued as described above.

Explanation follows regarding when the SPI signal from the battery monitoring IC 20 (IC2) is transmitted (communicated) to the controller 14 through the battery monitoring IC 20 (IC1). For such a case an example follows of when, for example, an SPI signal representing data related to battery voltage of a measured battery cell set 12 is transmitted (communicated) from the battery monitoring IC 20 (IC2) to the controller 14. A flow chart illustrating an example of flow of communication operation in the battery monitoring system 10 is illustrated in FIG. 9.

Note that in the battery monitoring IC 20 (IC2), since VCC1=VCC2, the INV signal is output at H level from the power supply voltage monitoring circuit 30 to the HV-LV converter 26HL of the communication level converter 26. Moreover, since the VCC1=VCC2, the communication level converter 26 and the high side communication section 28 are not driven even though they are being supplied with a signal (voltage).

Figure 9:
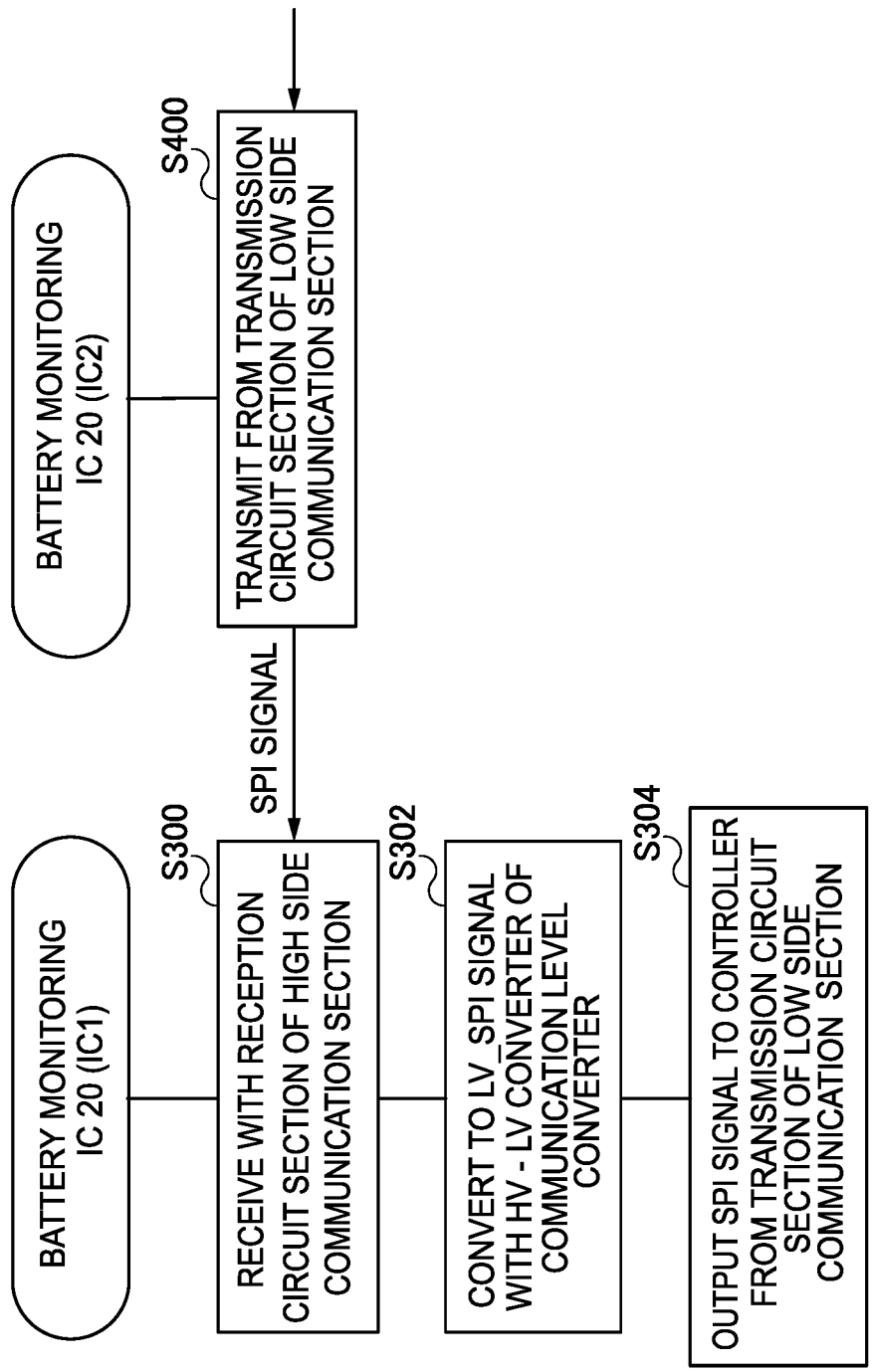
FIG. 9 is a flow chart illustrating an example of a flow of communication operation in a battery monitoring system of the present exemplary embodiment.

First, in the battery monitoring IC 20 (IC2), a signal output from each of the sections, such as the battery voltage measuring section 22, is transmitted through the transmission circuit section 24T of the low side communication section 24 (step 400 of FIG. 9).

In the battery monitoring IC 20 (IC1), the SPI signal transmitted from the battery monitoring IC 20 (IC1) is received by the reception circuit section 28R of the high side communication section 28 (step 300 of FIG. 9). The HV_SPI signal is output from the reception circuit section 28R to the HV-LV converter 26HL of the communication level converter 26. The HV-LV converter 26HL is driven due to the INV signal of the output of the power supply voltage monitoring circuit 30 being at L level. In the HV-LV converter 26HL, the input HV_SPI signal is converted to an SPI signal line of voltage level for the low side communication section 24 (LV_SPI signal) and output to the low side communication section 24 (step S302 of FIG. 9). In the low side communication section 24 the SPI signal is output to the controller 14 through the transmission circuit section 24T (step S304 of FIG. 9).

As explained above, the battery monitoring ICs 20 of the battery monitoring system 10 of the present exemplary embodiment are each equipped with the low side communication section 24, the communication level converter 26, the high side communication section 28, and the power supply voltage monitoring circuit 30. Since for the battery monitoring IC 20 (IC2) there is no battery monitoring IC 20 present at a higher position, the power supply voltage VCC2 that is the power supply voltage for driving and the power supply voltage VCC1 that is GND are both at the same potential (VCC1=VCC2), in a configuration such that the high side communication section 28 and the communication level converter 26 are not driven. The current consumption of the battery monitoring system 10 overall can accordingly be suppressed due to thereby being able to suppress the current consumption consumed by the communication level converter 26 and the high side communication section 28.

Note that since there is a presumption that the high side communication section 28 and the communication level converter 26 do not operate in the battery monitoring IC 20 (IC2), in order to suppress current consumption a configuration might be considered in which a semiconductor device omits provision of the high side communication section 28 and the communication level converter 26 in the battery monitoring IC 20 (IC2). However, in such a case different types of battery monitoring ICs 20 would need to be manufactured, and this is not preferable from for example the cost perspective due to having to make dedicated different battery monitoring ICs 20.

Moreover, in order to suppress current consumption, a configuration might be considered in which terminals are provided to each of the battery monitoring ICs 20 and individual IDs are set for the battery monitoring ICs 20 through these terminals, with the controller 14 specifying the ID of the battery monitoring IC 20 (IC2) and transmitting a halt signal to the high side communication section 28 of the battery monitoring IC 20 (IC2) to halt driving. However the drive voltages would differ in such a case depending on the battery monitoring IC 20, and the battery monitoring ICs 20 would be larger due to providing each of the terminals. Moreover, since it takes time to set the individual IDs, such a configuration is not preferable as a similar problem would arise to the problem of the time required for the current consumption to stabilize, as explained for the battery monitoring system 100 of the comparative example (see FIG. 11 and FIG. 12).

Consequently, preferably each of the battery monitoring ICs 20 (IC1, IC2) are configured the same as each other as in the present exemplary embodiment, and the VCC1=VCC2 is set so that the high side communication section 28 and the communication level converter 26 of the battery monitoring IC 20 at the highest position are not driven. Note that the potential difference is not limited to VCC 1=VCC2 as described above, as long as the potential difference between the power supply voltage VCC1 and the power supply voltage VCC2 is less than the respective drive voltages (threshold value voltages) of the high side communication section 28 and the communication level converter 26.

In the present exemplary embodiment, due to VCC1=VCC2 or the potential difference between VCC1 and VCC 2 being less than the respective drive voltages (threshold value voltages) of the high side communication section 28 and the communication level converter 26, the signal input from the high side communication section 28 to the communication level converter 26 is sometimes indefinite, as described above. In contrast, in the present exemplary embodiment the power supply voltage monitoring circuit 30 is also provided to detect that VCC1=VCC2, or that the potential difference between VCC1 and VCC 2 is less than the respective drive voltages (threshold value voltages) of the high side communication section 28 and the communication level converter 26, and to output a detection signal (INV signal) to the HV-LV converter 26HL of the communication level converter 26 when VCC1=VCC2, or the potential difference between VCC1 and VCC 2 is less than the respective drive voltages (threshold value voltages) of the high side communication section 28 and the communication level converter 26. In the HV-LV converter 26HL, the input voltage of the inverter INV3 is fixed to a specific level (0V) by the input voltage INV signal, and hence shoot-through current can be quickly suppressed from occurring. The influence of shoot-through current shoot-through current on the battery voltage measurement result can accordingly be suppressed, enabling the measurement precision of the battery voltage of the battery cell set 12 to be prevented from falling.

Figure 10:
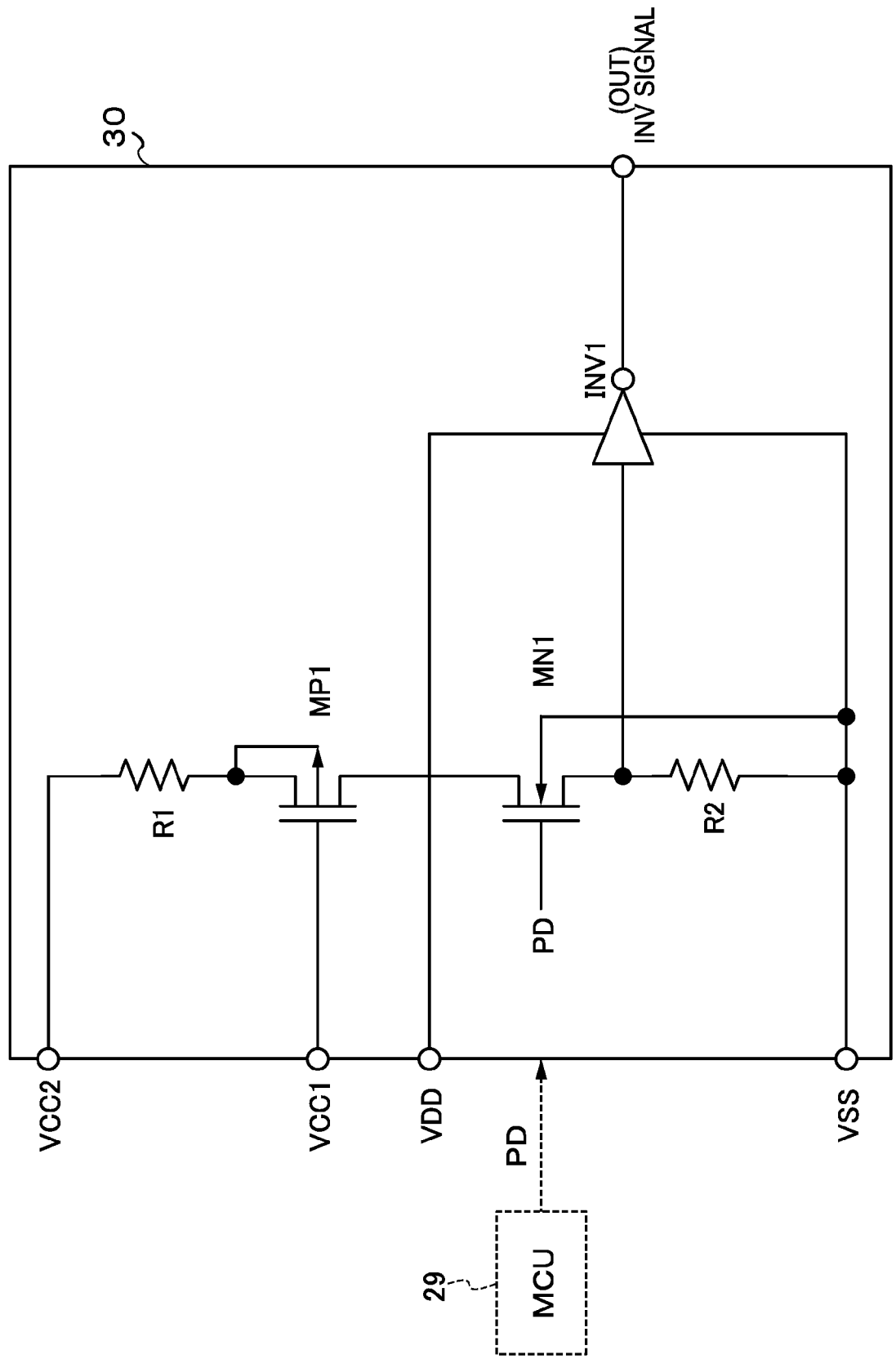
FIG. 10 is a circuit diagram illustrating another example of a power supply voltage monitoring circuit of the present exemplary embodiment.

Note that the configuration of the power supply voltage monitoring circuit 30 illustrated in the above exemplary embodiment (FIG. 4) is merely an example. There are no particular limitations to the configuration as long as the potential difference between the power supply voltage VCC2 and the power supply voltage VCC1 is detected, or more specifically as long as whether or not the potential difference exceeds the operating voltage of the communication level converter 26 and the high side communication section 28 is detected, and as long as a detection signal (INV signal) can be output at a level representing the detection result. An example of the power supply voltage monitoring circuit 30 is illustrated in FIG. 10. In the power supply voltage monitoring circuit 30 illustrated in FIG. 4, the gate of the NMOS transistor MN1 is fixed to the power supply, however instead of this, configuration may be made in as the power supply voltage monitoring circuit 30 illustrated in FIG. 10 such that the gate of the NMOS transistor MN1 is input with a power down (PD) signal. The PD signal is output from a controller 29 (such as an MUC) provided in each of the battery monitoring ICs 20 to the power supply voltage monitoring circuit 30 according to the operation state of the battery monitoring IC 20, with the PD signal expressing H level for operation mode and expressing L level at power down. In the power supply voltage monitoring circuit 30 illustrated in FIG. 10, VCC2−VCC1=VDD, and so the PMOS transistor MP1 and the NMOS transistor MN1 are in an ON state when the PD signal is H level, and current flows in the resistor R1 and the resistor R2. A voltage arises when current flows in the resistor R2, making the input voltage to the inverter INV1 H level and the output voltage L level. However, VCC2−VCC1=VDD, and the PMOS transistor MP1 and the NMOS transistor MN1 are in an OFF state when the PD signal is at L level. Current accordingly does not flow in the resistor R1 and the resistor R2. The input voltage of the inverter INV1 is accordingly at L level, and the output voltage is at H level. It is preferably to achieve a configuration such as described above in which a detection signal (INV signal) is output at a level according to the mode (operation mode/power down mode).

The number (number of stages) of the battery cell sets 12 and of the battery monitoring ICs 20 in the battery monitoring system 10 is not limited to those of the present exemplary embodiment. For example, the battery monitoring system 10 may be configured with multiple connected stages of 3 to 32 stages. In such multistage configurations, the highest stage battery monitoring IC 20 is configured similarly to the battery monitoring IC 20 (IC2) of the present exemplary embodiment, the lowest stage battery monitoring IC 20 is configured similarly to the configuration of the battery monitoring IC 20 (IC1) of the present exemplary embodiment, and the other battery monitoring ICs 20 are configured such that the low side communication section 24 of the battery monitoring IC 20 (IC1) of the present exemplary embodiment is connected to the high side communication section 28 of the lower stage battery monitoring IC 20.

The present exemplary embodiment is configured such that the low side communication section 24 of the lowest stage battery monitoring IC 20 (IC1) is connected to the controller 14, however there is no limitation thereto. For example, configuration may be made such that a battery monitoring IC 20 at an intermediate stage out of multistage connected battery monitoring ICs 20 is connected to the controller 14. In such cases, since this battery monitoring IC 20 is at the highest stage when communication is performed between each of the battery monitoring ICs 20, this battery monitoring IC 20 may be configured similarly to the battery monitoring IC 20 (IC2) of the present exemplary embodiment.

Moreover, although the present exemplary embodiment is configured with the power supply voltage monitoring circuit 30 provided to all of the battery monitoring ICs 20 in the battery monitoring system 10, there is no limitation thereto. For example, configuration may be made such that the power supply voltage monitoring circuit 30 is only provided to the highest position battery monitoring IC 20 (IC2). Note that configuration is preferably made with the power supply voltage monitoring circuit 30 provided to all of the battery monitoring ICs 20 since this avoids having to make dedicated different battery monitoring ICs 20.

Moreover, in the present exemplary embodiment explanation has been given of a case in which SPI communication is performed, however it should be understood that the method of communication is not limited to SPI communication.

The battery cells are also not limited to lithium ion rechargeable batteries, and other batteries may be employed. Note that lithium ion rechargeable batteries have the characteristics of obtaining a higher energy density (higher power density) compared to other rechargeable batteries, and have a high battery voltage per battery cell, a high electrical energy discharge efficiency, and also have no memory effect. Lithium ion rechargeable batteries are accordingly preferably employed in fields such as hybrid vehicles and motor driven machines.

Note that configuration of the battery monitoring system 10, the controller 14, the battery monitoring ICs 20, the high side communication section 28, the power supply voltage monitoring circuit 30 etc. and each of the operations explained in the above exemplary embodiment are merely examples thereof. It should be understood that various modifications are possible according to circumstances within a range not departing from the spirit of the present invention.

What is claimed is:

1. A battery monitoring system comprising:
    a plurality of battery cell sets of a specific number plurality of serially connected battery cells;
    a plurality of semiconductor devices that are each respectively provided to each of the plurality of battery cell sets and that each measure battery voltage of the corresponding battery cell set, wherein:
    each of the semiconductor devices comprises
        a measuring section that measures the battery voltage of the corresponding battery cell set,
        a high side communication section that is supplied with a drive voltage in a first voltage range, and, when a semiconductor device is present at a higher position that operates at a higher operating voltage than the operating voltage of the semiconductor device itself when measuring a battery cell set on the high side of the battery cell set measured by the semiconductor device itself, is capable of performing communication with the high side semiconductor device,
        a low side communication section that is supplied with a drive voltage in a second voltage range, and, when a semiconductor device is present at a lower position that operates at a lower operating voltage than the operating voltage of the semiconductor device itself when measuring a battery cell set on the low side of the battery cell set measured by the semiconductor device itself, is capable of performing communication with the low side semiconductor device, and
        a communication level converter that converts in both directions between the first voltage range of the high side communication section and the second voltage range of the low side communication section, that is capable of converting a high side communication signal input from the high side communication section to a low side communication signal and outputting the converted signal to the low side communication section, and that is capable of converting a low side communication section input from the low side communication section to a high side communication section and outputting the converted signal to the high side communication section;
    the semiconductor device at the highest stage in communication between the semiconductor devices further comprises a signal level determination section that detects the first voltage range of the high side communication section, and that determines the level of the low side communication signal that the communication level converter outputs to the low side communication section when the first voltage range is narrower than a specific voltage range; and
    the first voltage range of the highest stage is set to a specific voltage range narrower than the first voltage range of another of the semiconductor devices.

2. The battery monitoring system of claim 1, wherein the communication level converter comprises an inverter that is input with a voltage according to the second voltage range based on current according to the high side communication signal input from the high side communication section, and the signal level determination section determines the level of the low side communication signal by making the input voltage of the inverter a specific voltage.

3. The battery monitoring system of claim 1, wherein the first voltage range of the semiconductor device at the highest stage in communication between the semiconductor devices is less than the drive voltage that drives the high side communication section such that the high side communication section is not driven.

4. The battery monitoring system of claim 1, wherein the signal level determination section is provided in all of the semiconductor devices.

5. The battery monitoring system of claim 1, wherein:
the battery monitoring system further comprises a controller that controls the battery cell set battery voltage measurement; and
the semiconductor devices execute battery cell set battery voltage measurement under control from the controller.

6. The battery monitoring system of claim 5, wherein:
the controller outputs to the semiconductor device that measures the lowest position battery cell set a control signal to execute the battery voltage measurement, and the control signal is communicated in sequence through the semiconductor device to the semiconductor device that measures the battery cell set on the high side.

7. A semiconductor device comprising:
a high side communication section that is supplied with a drive voltage in a first voltage range, and, when a semiconductor device is present at a higher position that operates at a higher operating voltage than the operating voltage of the semiconductor device itself when measuring a battery cell set on the high side of the battery cell set measured by the semiconductor device itself that is one semiconductor device out of a plurality of semiconductor devices that are each respectively provided to each of a plurality of battery cell sets of collections of a specific number plurality of serially connected battery cells, is capable of performing communication with the high side semiconductor device;
a low side communication section that is supplied with a drive voltage in a second voltage range, and, when a semiconductor device is present at a lower position that operates at a lower operating voltage than the operating voltage of the semiconductor device itself when measuring a battery cell set on the low side of the battery cell set measured by the semiconductor device itself, is capable of performing communication with the low side semiconductor device;
a communication level converter that converts in both directions between the first voltage range of the high side communication section and the second voltage range of the low side communication section, that is capable of converting a high side communication signal input from the high side communication section to a low side communication signal and outputting the converted signal to the low side communication section, and that is capable of converting a low side communication section input from the low side communication section to a high side communication section and outputting the converted signal to the high side communication section;
a signal level determination section that detects the first voltage range of the high side communication section, and that determines the level of the low side communication signal that the communication level converter outputs to the low side communication section when the first voltage range is narrower than a specific voltage range.

* * * * *